(12) United States Patent
Kocaman et al.

(10) Patent No.: US 7,425,866 B2
(45) Date of Patent: Sep. 16, 2008

(54) DIGITALLY ADJUSTED VARIABLE GAIN AMPLIFIER (VGA) USING SWITCHABLE DIFFERENTIAL PAIRS

(75) Inventors: Namik Kemal Kocaman, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/857,553

(22) Filed: Sep. 19, 2007

(65) Prior Publication Data

US 2008/0007340 A1   Jan. 10, 2008

Related U.S. Application Data

(62) Division of application No. 11/116,159, filed on Apr. 27, 2005, now Pat. No. 7,292,101.

(51) Int. Cl.
*H03F 3/45* (2006.01)

(52) U.S. Cl. .................................. 330/254; 330/253
(58) Field of Classification Search ................ 330/252, 330/253, 254
See application file for complete search history.

(56) References Cited

U.S. PATENT DOCUMENTS

| | | | |
|---|---|---|---|
| 6,087,899 A | 7/2000 | Kubota | |
| 6,972,625 B2 | 12/2005 | Nguyen et al. | |
| 7,095,281 B2 * | 8/2006 | Zipper et al. | ........... 330/253 |
| 2006/0244530 A1 | 11/2006 | Kocaman et al. | |

* cited by examiner

*Primary Examiner*—Khanh V Nguyen

(57) ABSTRACT

A variable gain amplifier including a stage. The stage having a set of switchable differential pairs. The stage providing a gain range to a signal and adjusting a gain of the signal. At least one differential pair in each stage is permanently enabled. The variable gain amplifier may include a plurality of cascaded stages including the stage. In addition, the variable gain amplifier may be adjusted through an interleaved thermometer coding method.

7 Claims, 9 Drawing Sheets

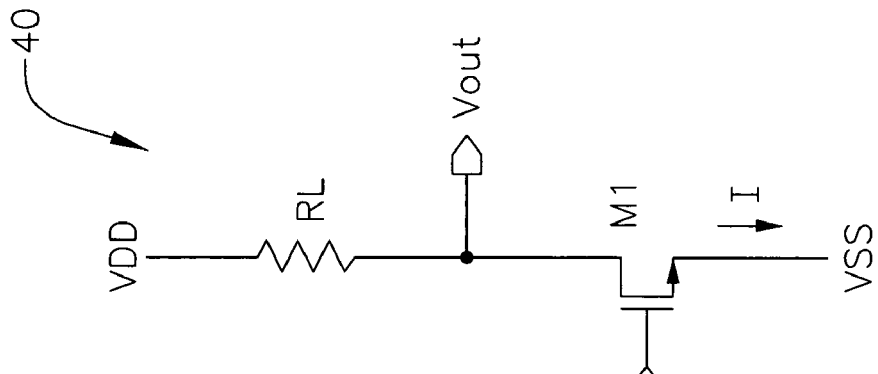
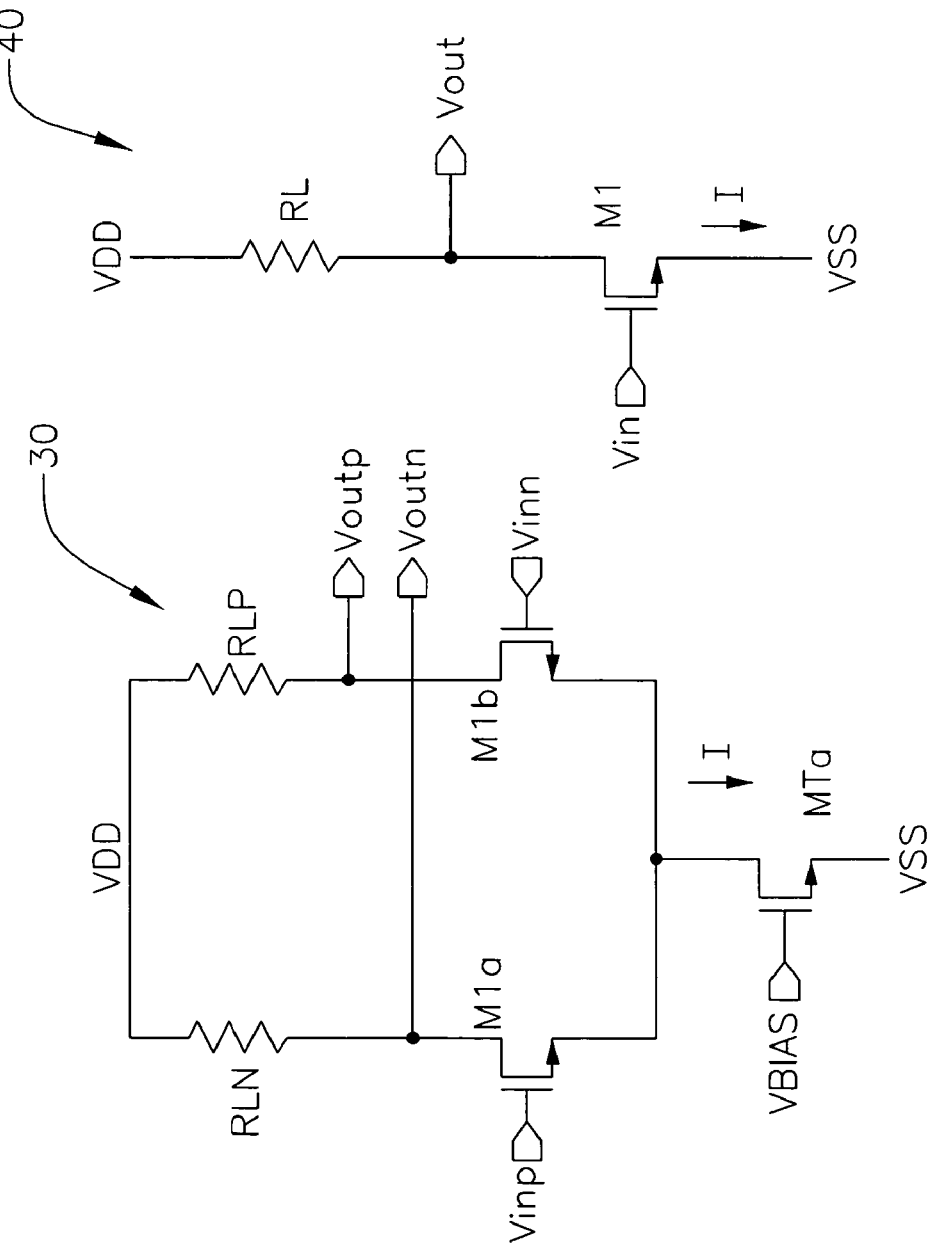

DIGITALLY ADJUSTED VARIABLE GAIN AMPLIFIER (VGA) USING SWITCHABLE DIFFERENTIAL PAIRS

CROSS-REFERENCE TO RELATED APPLICATION

This application is a divisional application of U.S. patent application Ser. No. 11/116,159, filed Apr. 27, 2005, entitled "Digitally Adjusted Variable Gain Amplifier (VGA) Using Switchable Differential Pairs," the disclosure of which is incorporated herein by reference in its entirety.

TECHNICAL FIELD

The present disclosure relates to an amplifier, and more particularly to a variable gain amplifier (VGA).

BACKGROUND

In many signal conditioning systems especially communication links, received information bearing signals are subject to amplitude adjustment using a VGA.

Amplitude adjustment or so called gain adjustment of an incoming signal by a VGA is used to reach an amplitude level well above the noise and offset thresholds; or, otherwise, it may not be feasible to perform further post processing of the incoming signal, such as adaptive equalization. On the other hand, amplitude adjustment by the VGA may detrimentally affect the incoming signal quality by introducing bandwidth reduction, non-linearity or distortion. Distortion is difficult to compensate using linear circuit techniques.

As such, it is desirable to devise an amplitude adjustment scheme using a VGA that is digitally controlled (or adjusted) such that the VGA is suitable for high bandwidth and high linearity applications with wide amplitude adjustment range.

SUMMARY

A system and/or method for providing amplitude adjustment using a variable gain amplifier (VGA) suitable for high bandwidth and high linearity applications, substantially as shown in and/or described in connection with at least one of the figures, as set forth more completely in the claims.

BRIEF DESCRIPTION OF THE DRAWINGS

The accompanying figures, together with the specification, illustrate exemplary embodiment(s) of the present invention, and, together with the description, serve to explain the principles of the present invention.

FIG. 1A is a diagram of one embodiment of a differential current mode logic circuit.

FIG. 1B is a diagram of a current mode logic half-circuit.

DETAILED DESCRIPTION

Exemplary embodiments of the invention provide an amplitude adjustment scheme using a digitally controlled, variable gain amplifier (VGA) suitable for high bandwidth and/or high linearity applications with wide amplitude adjustment range. In certain embodiments, a digitally adjusted VGA is provided using switchable differential pairs.

A VGA utilizes a differential current mode logic (CML) circuit 30 of FIG. 1A and a CML half-circuit 40 of FIG. 1B. The circuits of FIGS. 1A and 1B are foundation for the realization of a typical VGA cell. The gain or transfer function equation for the classical CML circuit can be derived from the gain of the half-circuit of FIG. 1B, which is shown in Equation 1 below.

$$\text{gain} = \frac{Vout}{Vin} = gm_{M1} \cdot R_L \quad \text{(Eq. 1)}$$

That is, the gain is directly proportional to the product of trans-conductance ($gm_{M1}$) for an input transistor M1 and resistor load $R_L$ of the CML half-circuit 40.

Equation 2 below shows that the gm is directly proportional to the square root of tail current I and the differential pair's aspect ratio (W/L), where K is a process constant that may be a product of gate oxide capacitance (Cox) and electron mobility constant μ.

$$gm = \sqrt{K \cdot (W/L) \cdot I} \quad \text{(Eq. 2)}$$

As can be derived from the above Equations 1 and 2, there are several alternate parameters that can be used to adjust gain in the CML structure.

Figure 2:
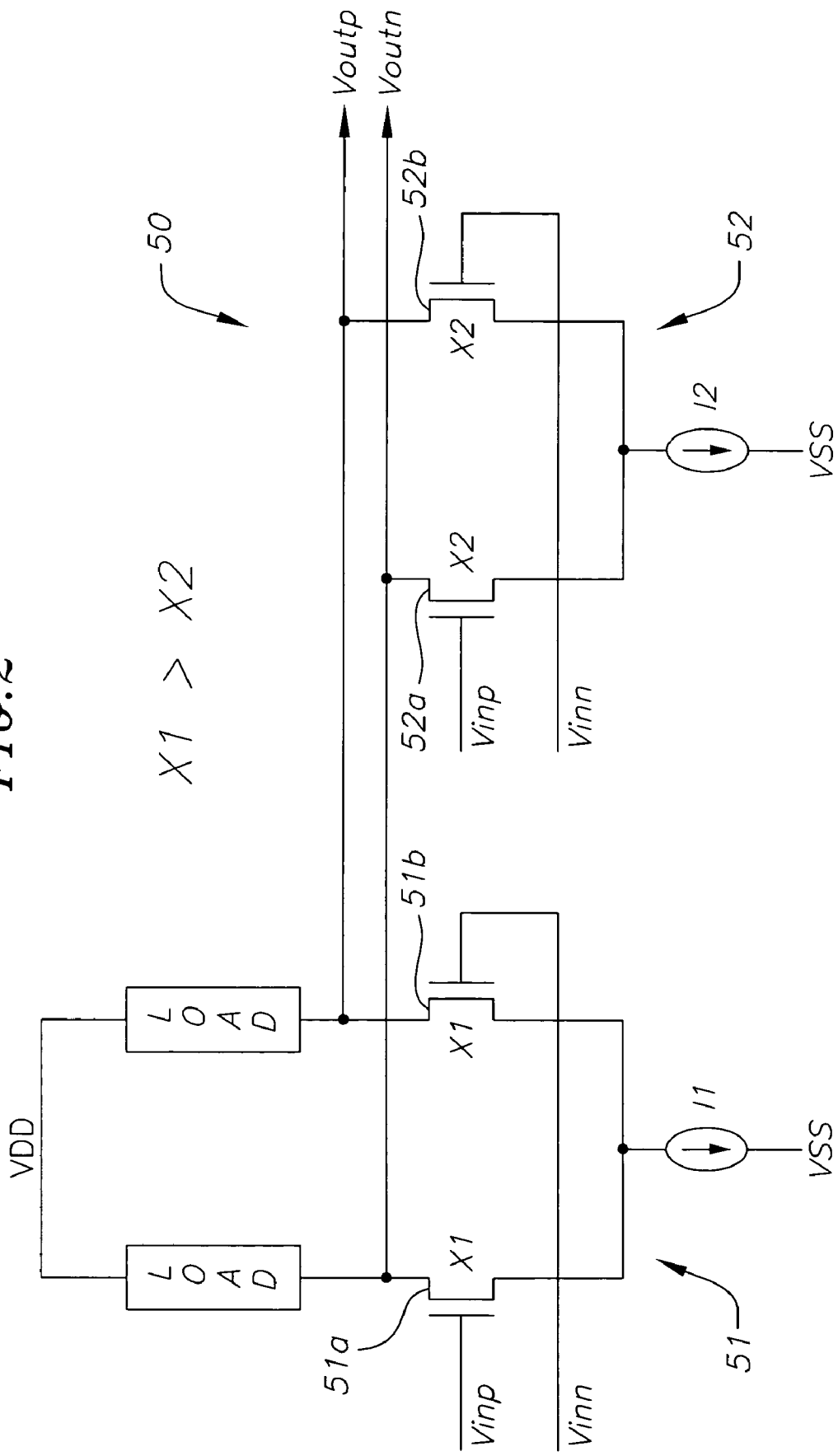
FIG. 2 is a diagram of a variable gain amplifier circuit.

As shown in a VGA circuit 50 of FIG. 2, one method for varying the gain is to use an analog current steering mechanism. The analog current steering mechanism is used to interpolate between two differential pairs 51, 52 that exhibit different gains (or between two groups of differential pairs having X1 and X2 total number of differential pairs that are separated into the two groups). In one embodiment to provide the different gains, assuming the aspect ratio (W/L) of each of the input transistors is the same (or at least L is the same), a multiple number (X1=M1×W/L) of input transistors 51a, 51b is provided to be larger than a multiple number (X2=M2×W/L) of input transistors 52a, 52b,. In another embodiment to provide the different gains, the aspect ratio (W/L) of the input transistors 51a, 51b is provided to be larger than the aspect ratio (W/L) of the input transistors 52a, 52b.

In more detail, the VGA circuit 50 of FIG. 2 has first and second differential pairs 51, 52. The first and second differential pairs 51, 52 have input transistors 51a, 51b and 52a, 52b, respectively. In the VGA circuit 50, an input signal Vinp is applied at gates of the input transistors 51a, 52a to generate an output signal Voutn, and an input signal Vinn is applied at gates of input transistors 51b, 52b to generate an output signal Voutp. As such, if a majority of the current is steered to one differential pair or one group of the differential pairs (e.g., the differential pair 52 coupled to a current I2 or X2 group), the current starved differential pair or group (e.g., the differential pair 51 coupled to a current I1 or X1 group) performs very poorly in linearity. That is, when the input signals (or amplitudes) Vinp, Vinn are high in magnitudes (requiring a low gain), a high distortion results due to the low current I1.

In order to limit the linearity degradation, limits on current steering percentages can be used for the VGA circuit 50 of FIG. 2. For example, rather than having 0 percent to 100 percent current steering between two differential pairs 51, 52, much lower spread such as 30 percent to 70 percent can be exercised. Limiting the current steering percentage, however, results in a reduced gain range. Thus, to compensate for this deficiency, the VGA circuit 50 using the analog current steering mechanism shown in FIG. 2 would require large input transistors 51a, 51b, 52a, 52b and/or large differential pairs 51, 52; consume large power and/or substrate area; and put restrictions on available bandwidth.

Figure 3:
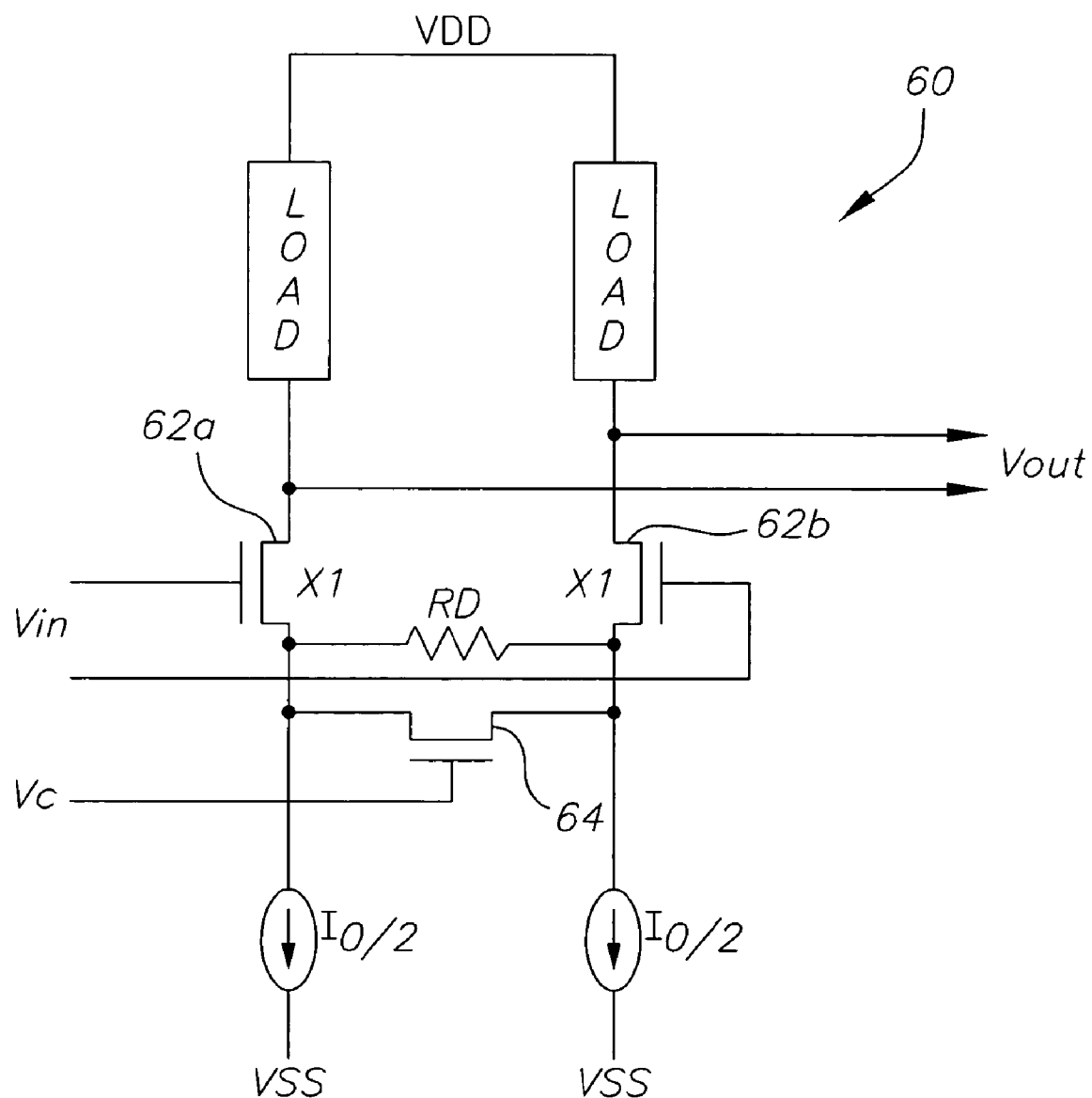
FIG. 3 is a diagram of one embodiment of a variable gain amplifier circuit.

Another method for varying the gain is to implement a resistance degeneration to adjust gain. The implementation of the resistance degeneration on a CML circuit is shown in FIG. 3 as a VGA circuit 60. In the VGA circuit 60, an input Vin is applied at gates of transistors 62a, 62b to generate differential output Vout. An effective degeneration resistance $R_{DEFF}$ is provided as a parallel combination of resistor $R_D$ and the resistance of a transistor 64. A gate of the transistor 64 is coupled to a voltage output Vc of a variable voltage source. This way, the resistance across the transistor 64 can be varied by varying the voltage Vc. The resulting transfer function is shown in Equation 3a with Equation 3b defining $R_{DEFF}$. In Equation 3a, gm is the trans-conductance of the input transistor 62a or 62b.

$$\frac{Vout}{Vin} = \frac{gm \cdot R_L}{1 + \frac{gm \cdot R_{DEFF}}{2}} \quad \text{(Eq. 3a)}$$

$$R_{DEFF} = \frac{R_{ON} \cdot R_D}{R_{ON} + R_D} \quad \text{(Eq. 3b)}$$

Although the VGA circuit 60 of FIG. 3 provides good linearity if the degeneration resistance $R_{DEFF}$ is linear and has low voltage dependency, there exists a high frequency zero in the transfer function of the differential pair due to the degeneration resistance $R_{DEFF}$ being in parallel with the parasitic capacitance at the source node of input transistors 62a, 62b of the differential pair. The location of this high frequency zero changes as the value of the degeneration resistance $R_{DEFF}$ for gain adjustment varies. As known to those skilled in the art, this high frequency zero can introduce not only excessive overshoot or undershoot on the VGA output signal, but also makes the variation of the VGA bandwidth more severe.

As envisioned, an exemplary embodiment of a VGA circuit uses a plurality of switchable differential pairs to provide different gains.

Figure 4:
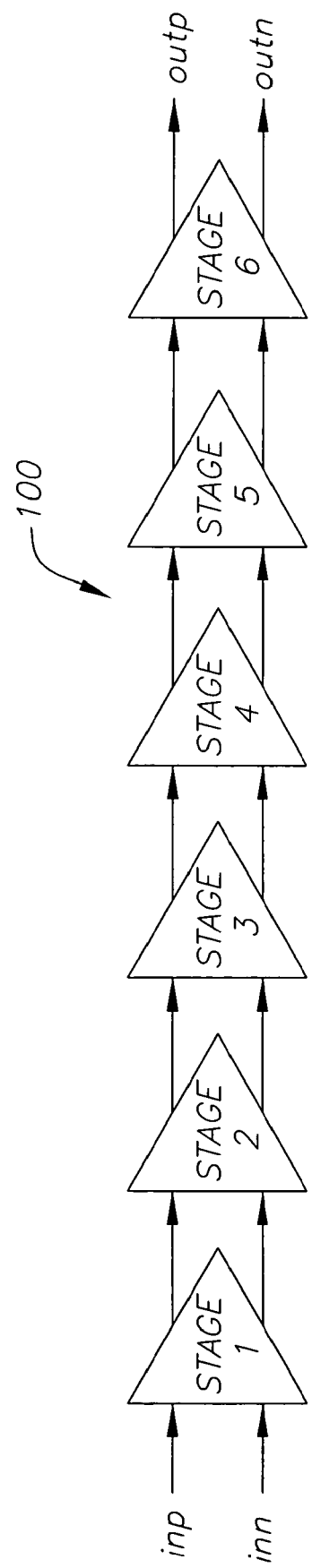
FIG. 4 is a diagram of one embodiment of a variable gain amplifier with cascaded stages.

A VGA embodiment of the present invention includes several VGA stages cascaded one after another. For example, as depicted in FIG. 4, six (6) cascaded stages have been utilized in an exemplary VGA circuitry 100. In this embodiment, the six (6) stages are used to optimize gain range versus bandwidth requirements. However, the present invention is not thereby limited. For example, without loss of generality, any number of stages can be utilized to achieve the desired specifications such as gain, bandwidth, power consumption, and/or substrate (or silicon) area.

Figure 5A:
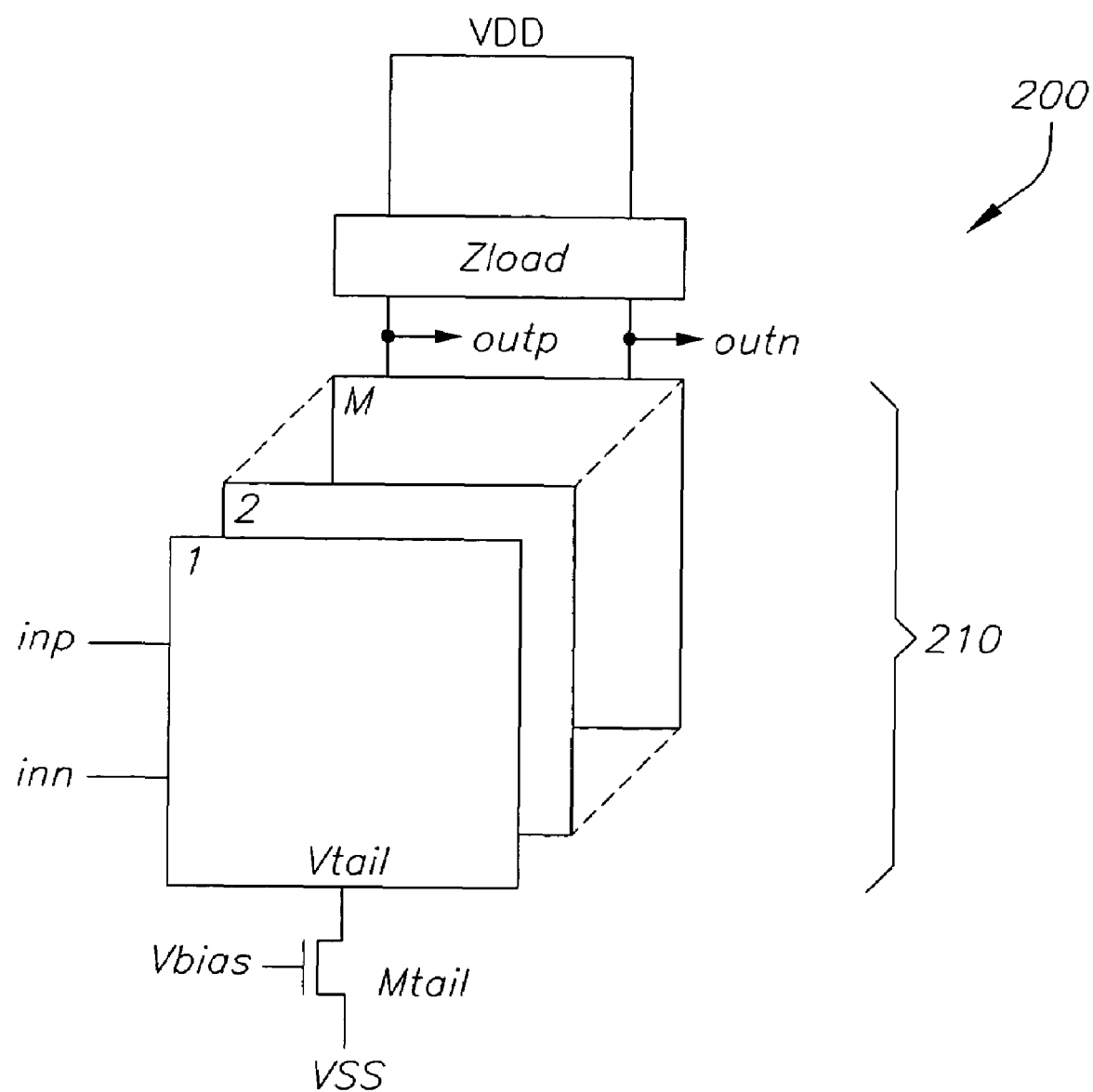
FIG. 5A is a diagram of one embodiment of a stage in a variable gain amplifier.

As shown in FIG. 5A, each stage 200 of an exemplary VGA circuitry (e.g., the VGA circuitry 100 of FIG. 4) includes M total number of differential pairs 210 connected to the same current source or the common current source transistor Mtail as well as the same load impedance Zload. The number M can be adjusted for further adjustment of gain range. As such, the stages of the VGA circuitry 100 of FIG. 4 provide a first adjustment of gain range and the M number of differential pairs 210 provide a second adjustment of gain range.

Figure 5B:
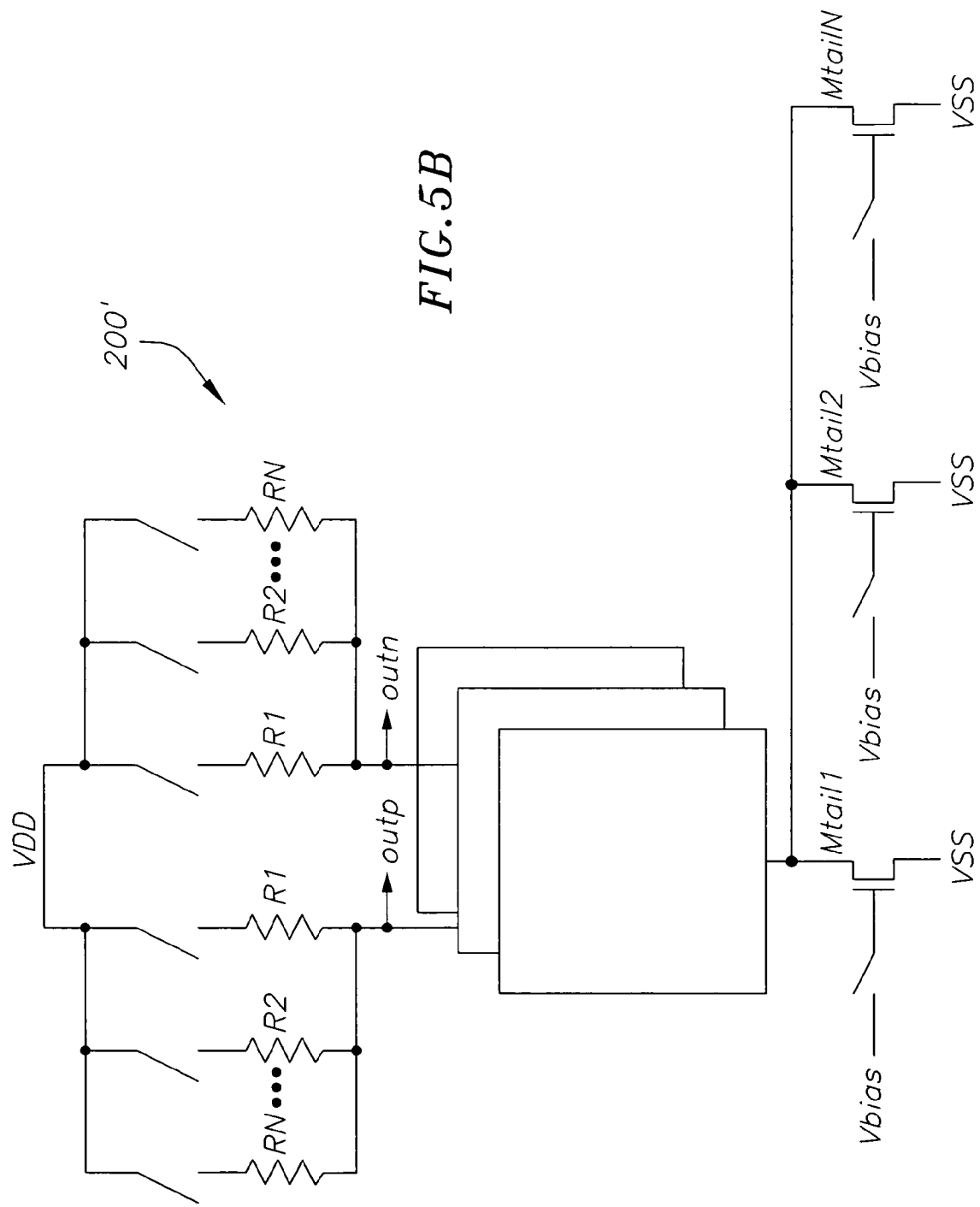
FIG. 5B is a diagram of one embodiment of a stage in a variable gain amplifier.

In addition and referring to FIG. 5B, as a modification to the stage 200 of FIG. 5A, a stage 200' of FIG. 5B can utilize a multiple number of current sources Mtail1, Mtail2, . . . Mtailn and/or load impedances R1, R2, . . . Rn. Using the multiple number of current sources Mtail1, Mtail2, . . . , Mtailn and/or load impedances R1, R2, . . . Rn can provide different bands of operation in terms of gain and bandwidth range. Multiple bands are particularly useful if a system needs to process multi-rate signals. The processing of multi-rate signals in communication links is practiced in systems where variable rate transceivers are deployed.

Figure 6:
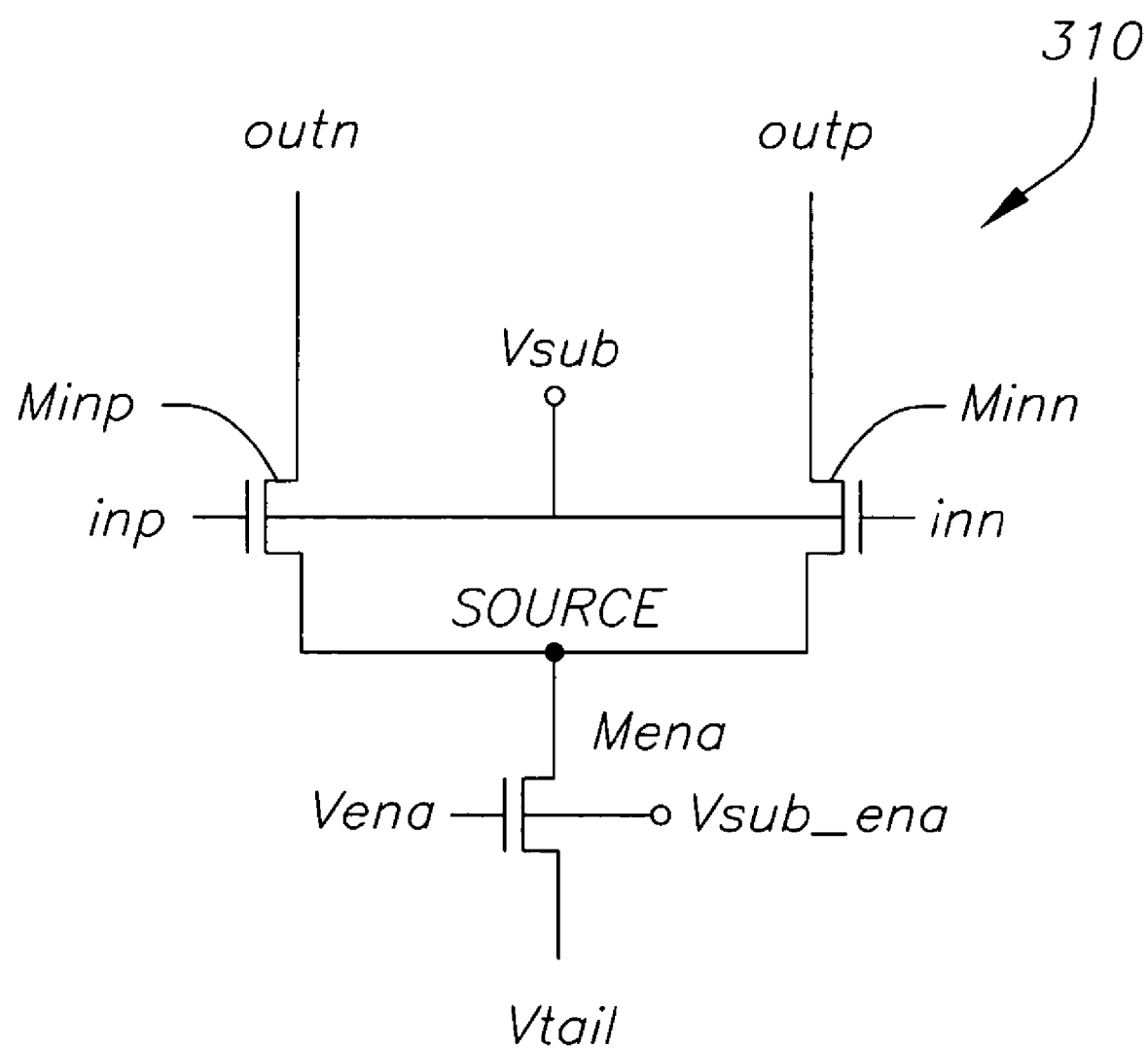
FIG. 6 is a diagram of one embodiment of a differential pair for a stage of a variable-gain amplifier.

As is depicted in FIG. 6, each differential pair 310 of an exemplary VGA stage (e.g., the stage 200 of FIG. 5A) includes three transistors, e.g., three NMOS transistors. In this embodiment, two of the transistors function as input transistors Minp, Minn and are used to provide gain. The third transistor MENA is connected to a current source (e.g., the common current source transistor Mtail of FIG. 5) and is used to selectively turn ON or OFF (or switch on or off) the differential pair 310 by letting or cutting the current passing through the transistors Minp, Minn. Although NMOS transistors are shown in FIG. 6, without loss of generality, PMOS transistors can be employed in certain embodiments of the present invention instead of NMOS transistors with the direction of current flow reversed. However, since NMOS transistors are generally faster than PMOS transistors due to faster electron mobility, NMOS transistors are used in certain embodiments for high speed operation. On the other hand, if matching and 1/f noise issues replace the need for speed, certain embodiments can use PMOS transistors instead.

Figure 7:
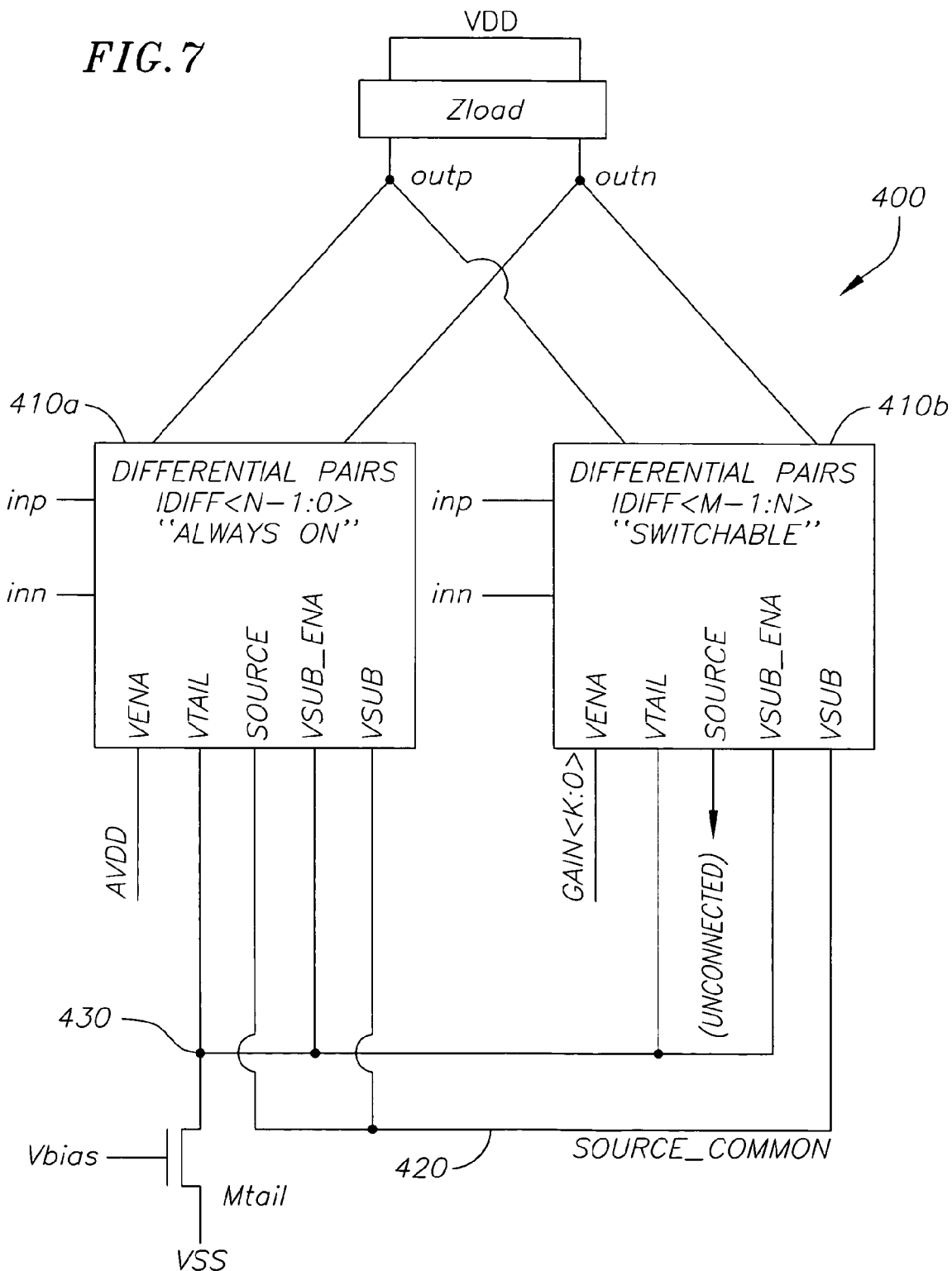
FIG. 7 is a diagram of one embodiment of a stage of a variable gain amplifier.

Referring to FIG. 7, for proper operation of each VGA stage 400 of an exemplary VGA circuitry (e.g., the VGA circuitry 100 of FIG. 4), at least N>0 number of differential pairs 410a should be always turned ON (or enabled) out of M total number of differential pairs 410 per VGA stage 400. Otherwise, there will be an undesired zero gain section through the stage 400 that will substantially prevent any signal conditioning. VSUB connections (substrate node) of all the N number of differential pairs 410a that are always ON are connected to a SOURCE node. In addition, the SOURCE nodes of all the N number of differential pairs 410a that are always ON are connected together. That is, a node that can be referred to as a SOURCE_COMMON node 420 (common node) is used to connect the SOURCE nodes of all the N number of differential pairs 410a that are always ON. The VSUB connections (substrate node) of all the other (M−N) number of differential pairs (or switchable differential pairs) 410b are also connected to the SOURCE_COMMON node 420. The VSUB of the (M−N) number of differential pairs should be tied to the SOURCE_COMMON node 420, or, otherwise, when OFF, the substrate connection of a differential pair 410b would be floating. In addition, as is known to those skilled in the art, this VSUB connection scheme will substantially eliminate substrate body effect and provide proper biasing for faster operation of the differential pairs. Similarly, a VSUB_ENA connection of all the M total number of differential pairs 410 is connected to a common VTAIL node 430. This will substantially eliminate the substrate body effect and reduce the ON resistance for the transistor MENA. As is known to those skilled in the art, with the lower ON resistance for the transistor MENA, a better headroom for MTAIL (i.e., a more stable current source MTAIL) as well as faster operation can be achieved.

For the N number of differential pairs 410a that are always ON, VENA connections are all tied to a voltage AVDD. For the other (M−N) number of differential pairs 410b that are switchable, there are (k+1) control signal lines named as GAIN<k:0> where k+1=m−n. Although the transistors MENA in the N number of differential pairs 410a that are always ON are not necessary and can be shorted out by connecting SOURCE and VTAIL nodes, it is valuable to keep them for better matching between the differential pairs in order to achieve a substantially uniform channel length modulation effect for transistor MTAIL among M total number of differential pairs 410. It should also be noted that gain adjustment should be monotonically increasing as GAIN<k:0> control signals are pulled up to the voltage AVDD sequentially. If the transistors MENA are shorted out, drain-to-source voltage (VDS) modulation for transistor MTAIL may degrade the gain monotonicity.

Referring now back to FIG. 4, for six (6) cascaded stages, the VGA circuitry 100 can have 6×(k+1) control signals for adjusting the overall gain provided through the VGA circuitry 100. In one embodiment, the VGA circuitry 100 uses an interleaved thermometer coding method to adjust the 6×(k+1) control signals. The operating principle of the interleaved thermometer coding method can be explained as follows.

Referring back to FIG. 7, every stage 400 of the VGA circuitry (e.g., the VGA circuitry 100) can have (k+1) control signals which correspond to (k+1) switchable differential pairs 410b,. If a control signal is turned ON, a differential pair of the switchable differential pairs 410b associated with that control signal gets turned ON (or switched ON). Thermometer coding ensures that switchable differential pairs 410b are turned ON or OFF one at a time in a linear sequence. In order to make the overall gain more uniform and almost constant in step size, an embodiment of the VGA circuitry uses the interleaved thermometer coding method among the six (6) cascaded stages (e.g., the 6 stages of FIG. 4). For example, if switchable differential pair #3 is turned ON in STAGE 1, then next time it will be switchable differential pair #3 in STAGE 2 that will be turned ON. Once switchable pair #3 in STAGE 6 (or last one) is turned ON, then switchable pair #4 in STAGE 1 will be turned ON. Since the embodiment interleaves the thermometer coding among the stages from the first stage towards the last, and cycles back to the first one, the cycled scheme can be referred to as an interleaved thermometer coding scheme.

By way of a more specific example, for k=30, an embodiment of the present invention can have (6×(k+1))+1=187 settings for gain adjustment. In particular, Table 1 below can be used to visualize how the switchable differential pairs (e.g., the switchable differential pairs 410b) among the stages (e.g., the 6 stages of FIG. 4) of the present embodiment can be turned ON or OFF using the interleaved thermometer coding method.

TABLE 1

Number of differential pairs turned ON versus Gain Setting (1-187) where k = 30 (e.g., 31 differential pairs can be switched-on or -off per stage).

| GAIN SETTING | STAGE 1 | STAGE 2 | STAGE 3 | STAGE 4 | STAGE 5 | STAGE 6 |
|---|---|---|---|---|---|---|
| 1 | 0 | 0 | 0 | 0 | 0 | 0 |
| 2 | 1 | 0 | 0 | 0 | 0 | 0 |
| 3 | 1 | 1 | 0 | 0 | 0 | 0 |
| 4 | 1 | 1 | 1 | 0 | 0 | 0 |
| 5 | 1 | 1 | 1 | 1 | 0 | 0 |
| 6 | 1 | 1 | 1 | 1 | 1 | 1 |
| 7 | 2 | 1 | 1 | 1 | 1 | 1 |
| 8 | 2 | 2 | 1 | 1 | 1 | 1 |
| . | . | . | . | . | . | . |
| . | . | . | . | . | . | . |
| . | . | . | . | . | . | . |
| 185 | 31 | 31 | 31 | 31 | 30 | 30 |
| 186 | 31 | 31 | 31 | 31 | 31 | 30 |
| 187 | 31 | 31 | 31 | 31 | 31 | 31 |

Because of the interleaved thermometer coding method of Table 1, the VGA circuitry can be provided with 1) monotonic as well as almost uniform step size in gain adjustment and 2) glitch prevention. Also, the interleaved thermometer coding method of the present embodiment will ensure only one control signal toggling at each adjustment. This one at a time toggling will substantially prevent any undesired glitches on the signal integrity. Furthermore, the slewing speed of control signals may be slowed down by employing RC filters. This will further reduce or minimize any undesired glitches.

In view of the forgoing, since a VGA circuitry of an exemplary embodiment has a constant tail current in each VGA stage that is feeding both the "always on" and the "switchable" differential pairs, the current density of differential pairs that are turned ON increases as gain decreases (because less pairs are turned ON). Higher current density in the differential pair increases the linear range of the differential pair. This is important since a VGA circuitry needs better linearity at lower gains when the input signal is large in amplitude. In addition, as gain decreases to accommodate larger input amplitudes, the VGA circuitry of the exemplary embodiment automatically adjusts itself to perform better in terms of linearity.

Figure 8:
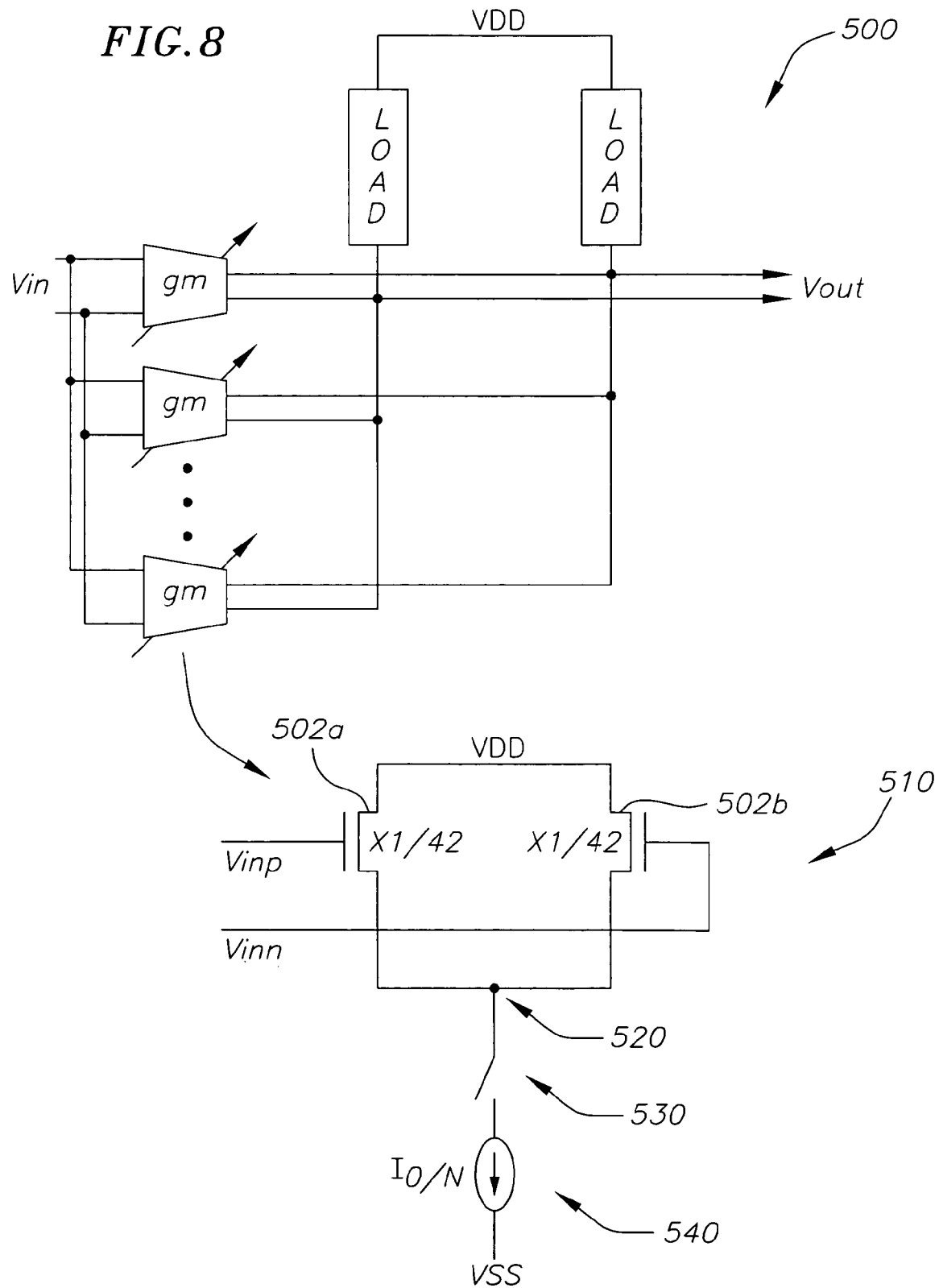
FIG. 8 is a diagram of one embodiment of a variable gain amplifier.

In general and referring to FIG. 8, due to substrate connection scheme described above in FIG. 7, a parasitic well capacitance of an exemplary VGA circuitry 500 of the present invention associated with input transistors 502a, 502b of a differential pair 510 does not slow down a source node 520. This helps to achieve faster operation. In addition, the VGA circuitry 500 can utilize higher supply voltages (>1.2V) for sub-micron CMOS processes by the use of the substrate connection scheme described above without endangering reliability limits of the transistors (e.g., 502a, 502b). In this embodiment, the differential pair 510 represents one of 42 pairs of differential pairs (as schematically represented by X1/42), and the source node 520 of the differential pair 510 is connected to a switch 530 (e.g., a transistor MENA of FIG. 6). In addition, the switch 530 is in turn connected to a current source 540 (e.g., a transistor Mtail of FIG. 5 or FIG. 7). Moreover, in operation, the interleaved thermometer coding method described above gives a monotonic and substantially uniform step size gain adjustment to the embodiment of FIG. 8.

As such, unlike the analog current steering mechanism that is depicted in FIG. 2, which would require X1+X2 total number of differential pairs, the embodiment of FIG. 8 would only need X1 total number of differential pairs and provide better gain range versus linearity for a given power consumption and bandwidth budget.

In addition, unlike the degeneration resistance scheme of FIG. 3 that has a high frequency zero in the transfer function of the differential pair due to the degeneration resistance being in parallel with the parasitic capacitance at the source node of input transistor of the differential pair, the VGA circuitry 500 of FIG. 8 does not have such a high frequency zero problem. In addition, the total GATE capacitance at the input of each VGA stage of FIG. 8 does not change significantly, thereby providing the VGA circuitry 500 of FIG. 8 with a better bandwidth control.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A device comprising:
    a first circuit comprising at least two switchable differential pairs and at least one permanently enabled differential pair, the first circuit being configured to adjust a first gain of a signal by progressively enabling or disabling the at least two switchable differential pairs; and
    a second circuit coupled to an output of the first circuit, the second circuit comprising a set of switchable differential pairs and being configured to adjust a second gain of the signal from the first circuit.

2. The device of claim 1, wherein the second circuit further comprises at least one permanently enabled differential pair.

3. The device of claim 1, wherein the first circuit further comprises a separate respective metal-oxide-semiconductor field-effect transistor (MOSFET) for each of the at least two switchable differential pairs and the at least one permanently enabled differential pair.

4. The device of claim 1, wherein the device is configured to enable or disable the switchable differential pairs in the first circuit using an interleaved thermometer coding.

5. The device of claim 1, wherein the first circuit further comprises a load impedance component shared by each of the differential pairs.

6. The device of claim 1, wherein a common node is electrically coupled to a substrate node of each of the at least two switchable differential pairs and to a source node and a substrate node of each of the at least one permanently enabled differential pair.

7. The device of claim 1, wherein the first circuit is configured to adjust the gain of the signal monotonically by progressively enabling or disabling the at least two switchable differential pairs.

* * * * *